(12) United States Patent
Oksuz et al.

(10) Patent No.: US 7,589,470 B2
(45) Date of Patent: Sep. 15, 2009

(54) METHOD AND APPARATUS FOR PRODUCING PLASMA

(75) Inventors: Lutfi Oksuz, Isparta (TR); Albert Rogers Ellingboe, County Dublin (IE)

(73) Assignee: Dublin City University, Dublin (IE)

( * ) Notice: Subject to any disclaimer, the term of this patent is extended or adjusted under 35 U.S.C. 154(b) by 402 days.

(21) Appl. No.: 11/343,682

(22) Filed: Jan. 31, 2006

(65) Prior Publication Data

US 2007/0176709 A1 Aug. 2, 2007

(51) Int. Cl.
*H01J 25/50* (2006.01)
*H01P 7/06* (2006.01)

(52) U.S. Cl. .............. 315/39.71; 315/39.77; 315/39.53; 315/39.3; 315/39; 333/230; 333/239; 333/99 PL; 333/242

(58) Field of Classification Search ................. 315/39.3, 315/39.53, 39.55, 39.57, 500–506, 39, 39.51, 315/39.77, 39.71, 39.63; 333/111, 110, 113, 333/114, 124, 32, 35, 34, 33, 157–159, 99 PL, 333/242, 240, 239, 230, 227, 212, 81 B
See application file for complete search history.

(56) References Cited

U.S. PATENT DOCUMENTS

| | | | | |
|---|---|---|---|---|
| 4,382,208 A | * | 5/1983 | Meddaugh et al. ......... 315/5.41 |
| 4,634,992 A | | 1/1987 | Brown ......................... 330/47 |
| 5,172,083 A | | 12/1992 | Hidaka et al. ............ 333/99 PL |
| 5,206,471 A | | 4/1993 | Smith .................... 219/10.55 R |
| 5,232,507 A | | 8/1993 | Ohtoshi et al. .............. 118/719 |
| 5,523,651 A | * | 6/1996 | Santoru et al. ................ 315/39 |
| 5,624,592 A | | 4/1997 | Paustian ..................... 219/679 |
| 5,714,009 A | | 2/1998 | Boling ............... 118/723 MW |
| 5,821,694 A | * | 10/1998 | Young ........................ 315/5.41 |
| 5,895,558 A | | 4/1999 | Spence ....................... 204/164 |
| 6,029,602 A | | 2/2000 | Bhatnagar ............ 118/723 ME |
| 6,054,694 A | | 4/2000 | Paustian ..................... 219/679 |
| 6,111,237 A | | 8/2000 | Paustian ..................... 219/687 |

(Continued)

OTHER PUBLICATIONS

*Efficient, Modular Microwave Plasma Torch for Thermal Treatment*, by Kamal Hadidi* and Paul Woskov, Plasma Science and Fusion Center, Massachusetts institute of Technology, Cambridge, MA 02139 (10 pages) *Corresponding author: Hadidi@psfc.mit.edu.

(Continued)

*Primary Examiner*—Tuyet Vo
(74) *Attorney, Agent, or Firm*—Mark S. Leonardo; Shelly L. Shaw; Brown Rudnick LLP

(57) ABSTRACT

A method and apparatus for producing a distributed plasma at atmospheric pressure. A distributed plasma can be produced at atmospheric pressure by using an inexpensive high frequency power source in communication with a waveguide having a plurality particularly configured couplers disposed therein. The plurality of particularly arranged couplers can be configured in the waveguide to enhance the electromagnetic field strength therein. The plurality of couplers have internal portions disposed inside the waveguide and spaced apart by a distance of ½ wavelength of the high frequency power source and external portions disposed outside the waveguide and spaced apart by a predetermined distance which is calculated to cause the electromagnetic fields in the external portions of adjacent couplers to couple and thereby further enhance the strength of the electromagnetic field in the waveguide. Plasma can be formed in plasma areas defined by gaps between electrodes disposed on the external portions.

20 Claims, 4 Drawing Sheets

U.S. PATENT DOCUMENTS

| | | | | |
|---|---|---|---|---|
| 6,362,449 | B1 | 3/2002 | Hadidi et al. | 219/121.36 |
| 6,407,505 | B1* | 6/2002 | Bertsche | 315/5.41 |
| 6,866,747 | B2 | 3/2005 | Tadera et al. | 156/345.41 |
| 6,881,922 | B2 | 4/2005 | Nishida et al. | 219/121.54 |
| 6,897,615 | B2 | 5/2005 | Janos et al. | 315/111.21 |
| 7,112,924 | B2* | 9/2006 | Hanna | 315/5.41 |
| 2003/0179054 | A1* | 9/2003 | Murakami et al. | 333/219 |
| 2004/0182834 | A1* | 9/2004 | Kamarehi | 219/121.43 |

OTHER PUBLICATIONS

*Waveguides and Cavity Resonators*, copyright D.Jefferies 1996, 1997, 1999, 2002, 2005 http://www.ee.surrey.ac.uk/Personal/D.Jefferies/wguide.html (10 pages.

2.45GHz Microwave Cavity thread 239-119415, http://www.eng-tips.com/viewthread.cfm?qid=119415&page=1 (5 pgs).

Plasma Sources Science and Technology, *Plasma generation and plasma sources* by H Conrads and M. Schmidt, INP Greifswald, Institut für Niedertemperatur-Plasmaphysik e.V., Friedrich Ludwig-Jahn-Str. 19, D-17489 Griefswald, Germany, Received Oct. 1, 1999, in final form Sep. 27, 2000 Print publication: Issue 4 (Nov. 2000), http:www.iop.org/EJ/abstract/0963-0252/9/301 (2 pgs).

Journal of Physics D: Applied Physics, *Design and construction of a 2.45 GHz waveguide-based microwave plasma jet at atomospheric pressure for material processing*, by A I Al-Shamma'a, S R Wylie, J Lucas and C F Pau, Received Feb. 7, 2001 Published Sep. 5, 2001, Print publication: Issue 18 (21 Sep. 21, 2001), http://www.iop.org/EJ/abstract/0022-3727/34/18/304 (2 pgs).

*Physics of the Microwave Oven*, M. Vollmer, U. Appl. Sci. Brandenburg, Germany (will be published in Jan. 2004 in Physics Education) (11 pgs).

* cited by examiner

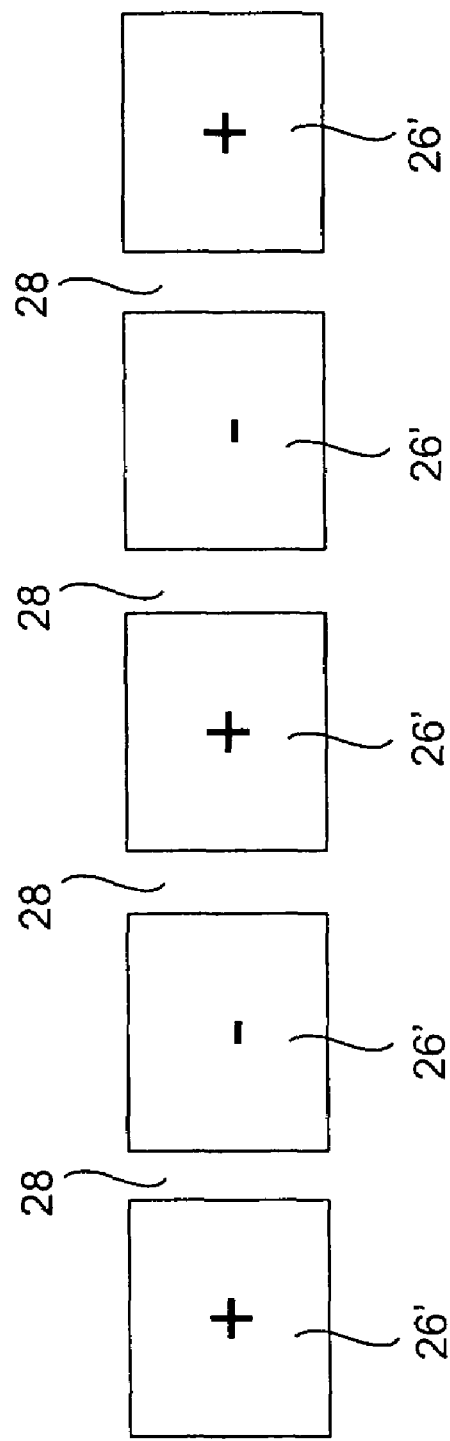
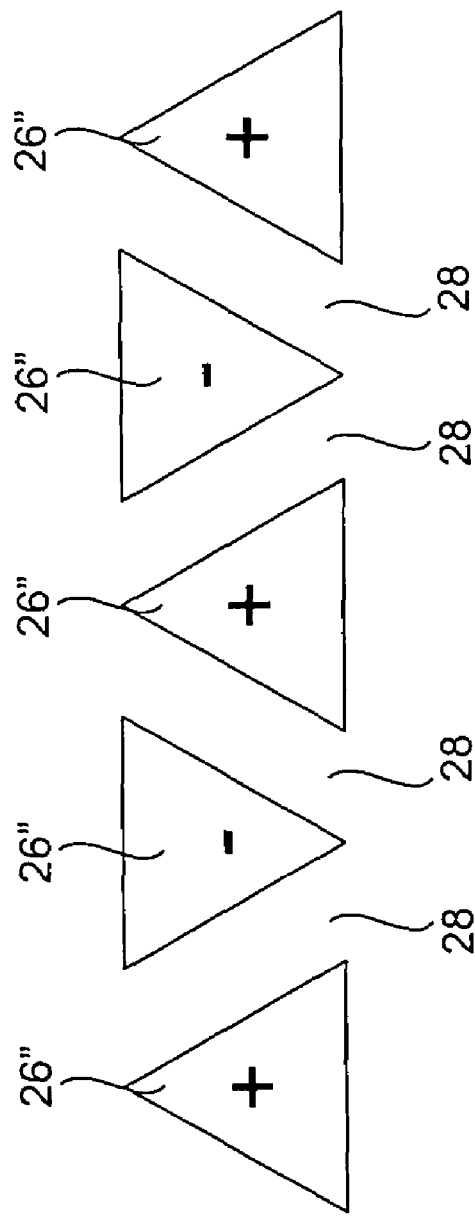

METHOD AND APPARATUS FOR PRODUCING PLASMA

FIELD OF THE INVENTION

The present invention relates to the field of plasma production and more particularly to economical production of plasma at atmospheric pressure.

BACKGROUND OF THE INVENTION

In the semiconductor industry, plasmas are used to deposit materials on and etch materials from work-pieces to form specific electronic components on the work-piece substrate. Plasmas that are used in semiconductor fabrication processes are commonly generated by ionizing a gas in a vacuum chamber. For example, a gas can be introduced into an evacuated plasma chamber where the work-piece is located. A strong electric field can be applied to the plasma chamber. The gas can form a plasma in an excitation region by undergoing an electrical breakdown under the influence of the strong electric field.

The electric field in such chambers is typically either capacitively or inductively coupled to the gas to remove electrons therefrom. In capacitively coupled plasma generators, the electric field can be applied between electrodes on opposing sides of the chamber. In inductively coupled plasma generators, the electric field can be applied to a coil surrounding the chamber.

Vacuum chambers can be problematic and unduly expensive for use in certain applications. Vacuum plasma chambers can be disadvantageous because certain vacuum components are expensive, cumbersome and require high maintenance. Accordingly, plasma generators have been developed which can produce plasma at atmospheric pressure.

Methods of producing plasma at atmospheric pressure include dielectric barrier discharge, arcs and plasma jets. These types of plasma generators tend to produce non-uniform plasma distributions, which are often referred to as filamentary discharges, in the chamber. Such atmospheric pressure plasma generators have a tendency to damage surfaces of work-pieces. For example, work-pieces in presently known atmospheric pressure plasma generators can be subject to arcing and/or levels of directional current which can cause heat damage to their surfaces. Methods for converting the discharge into a broad-area 'glow' discharge and thus reducing the resultant heat damage in atmospheric pressure plasma chambers have been attempted by adding helium to the chamber. These methods have been less than optimal because they consume excessive quantities of helium.

Plasma jets are known which use a microwave source to produce a plasma distribution that is very localized. Like arcing, the localized high ion flux that occurs in plasma jet systems can damage a surface such of a work-piece.

In certain plasma generators, the power source that drives the electrodes and/or coil is a high frequency (HF) source in the radio frequency (RF) range or ultra-high frequency (UHF) range, i.e., from about 30 kHz to about 300 GHz. The HF source typically controls the plasma density in the chamber. Certain dual-frequency plasma generators also include a low frequency (LF) source or direct current (DC) source driving one or more electrodes in the plasma chamber. The LF or DC source typically controls the energy of ions that strike a work-piece in the chamber. The use of two power sources makes this type of plasma generator very expensive.

SUMMARY OF THE INVENTION

Embodiments of the present invention provide a low cost and environmentally friendly method and apparatus for producing a plasma at atmospheric pressure. An illustrative embodiment of the invention produces plasma using a high frequency power source in communication with a waveguide. The illustrative embodiment enhances an electric field to produce plasma by using a plurality of particularly designed couplers configured with the waveguide. The couplers extend through the waveguide wall and include internal portions inside the waveguide. The internal portions are spaced according to half-wavelengths of a high frequency power source that provides power to the waveguide so that adjacent couplers are 180 degrees out of phase with each other. The couplers include external portions that can be spaced apart from external portions of adjacent couplers by a distance that is different from the spacing distance of the internal portions. The spacing of the external portions of adjacent couplers can be chosen to increases the electric field between them.

The external portions include plasma-facing electrodes having edges in close proximity to each other. The field strength in the vicinity of the inter-electrode gap created there-between is thereby increased to produce a distributed plasma "glow" in the gaps.

In an illustrative embodiment, spacing between the internal portions of the couplers can be determined by using the following formula: Spacing=$c/(2*f*VF)$, where 'c' is the speed of light in vacuum, 'f' is the frequency, and 'VF' is the velocity factor of the waveguide. The internal portion of the couplers can be placed at or near the peak of the electric or magnetic field depending on the nature of the stub couplers. For example, although the illustrative embodiments of the invention are described herein as having couplers which couple to the electric field in a waveguide, it is envisioned that persons having ordinary skill in the art could design couplers having internal portions adopted for coupling to the magnetic field in the waveguide. In one example, an internal portion of a coupler could be shaped as a loop terminating on an internal wall of the waveguide. Such couplers to the magnetic field could also produce high voltages between electrodes on the external portion and produce a distributed plasma in the gaps between the electrodes at atmospheric pressure within the scope of the present disclosure.

Embodiments of the present invention can be modified to use numerous types of high frequency power sources having a frequency range in excess of about 1 GHz. In an illustrative embodiment, the method employs a high frequency power source such as 2.45 GHz magnetron that is widely available and is commonly used in microwave ovens. A circulator and matched load prevents the magnetron from receiving reflected power. A directional coupler is used to measure forward and reflected power. Couplers are introduced into a waveguide section with the high amplitude standing waves wherein the internal portions of the couplers are arranged with ½ wavelength spacing and aligned with the large amplitude electric or magnetic fields, depending on nature of the internal component of the couplers. External portions of the couplers come into close proximity with adjacent couplers, so the field amplitude in the gaps between external portions is further enhanced.

In an illustrative embodiment of the invention, the plasma generator includes a waveguide that is a TE10 mode rectangular waveguide. The waveguide directs power to a plasma area between electrodes coupled to fields in the waveguide. The plasma area contains a gas at about atmospheric pressure. Application of high frequency power from the high frequency power source to the plasma area uniformly ionizes the gas along the boundary between electrodes.

In a particular embodiment of the invention, the couplers are arranged to form a plurality of electrodes in a regular array. Illustrative embodiments of the present invention further include a circulator in communication with the high frequency power source. Matched loads can be configured with the circulator as known in the art. A directional coupler can be disposed between the circulator and the waveguide and adapted to prevent reflected power from damaging the high frequency power source. A stub tuner (or other tuning element) may be placed between the power source and the coupling elements. The stub tuners or other tuning elements combine forward waves from the directional coupler with forward wave portions of the field in the coupled portion of the waveguide to amplify both forward and reflected wave portions of the field in the coupled portion of the waveguide.

In one embodiment of the present invention, the plasma generator includes a waveguide having a first end and a second end, wherein the first end is in communication with a high frequency power source and wherein the second end is short circuited. In an alternative embodiment, the plasma generator includes a second high frequency power source which has a fixed phase relationship with the first high frequency power source in communication with the waveguide, wherein the waveguide includes a first end in communication with the (first) high frequency power source and a second end in communication with the second high frequency power source.

A particular embodiment of the present invention provides a plasma generator including a 2.45 GHz magnetron in communication with a circulator. Matched loads in communication with the circulator and a directional coupler in communication the circulator are adapted to prevent reflected power from damaging the 2.45 GHz magnetron. A TE10 mode rectangular waveguide having a first end and a second end can be used wherein the first end is in communication with the directional coupler and receives microwave energy from the magnetron. The second end can be short circuited such that a standing wave can be formed in the waveguide.

In another illustrative embodiment, the present invention provides plasma generating means including a high frequency power source in communication with waveguide means and coupler means in communication with the waveguide means. Persons having ordinary skill in the art should appreciate that waveguide means can include one or more of a plurality of structures that is (are) configured for efficient transmission of electromagnetic waves of a particular frequency. Waveguide means can include, for example, a rectangular waveguide, a cylindrical waveguide, parallel plate waveguides or coils of co-axial cable, and the like as known in the art. The coupler means have internal portions aligned with peaks of a standing wave in the waveguide and external portions spaced apart by a distance chosen to enhance the electric field strength in the waveguide. Persons having ordinary skill in the art should appreciate that coupler means can include one or more of a plurality of coupler types such as, for example, stub tuners, electrodes, adjustable geometry cavities, fixed geometry cavities and the like as known in the art.

In yet another illustrative embodiment, the present invention provides a method of generating a distributed plasma including the steps of spacing internal portions of couplers in a waveguide to align the internal portions with peaks of a standing wave in the waveguide and spacing external portions of the couplers by a distance chosen to enhance electric field strength in the waveguide. High frequency power is applied to the waveguide to generate a distributed plasma in the space between electrodes on the external portions of the couplers wherein the electrodes are disposed in a near-atmospheric pressure environment.

BRIEF DESCRIPTION OF THE DRAWINGS

The foregoing and other features and advantages of the present invention will be more fully understood from the following detailed description of illustrative embodiments taken in conjunction with the accompanying drawings in which:

FIGS. 3A and 3B are bottom views of alternative exemplary electrode configurations that can be used in illustrative embodiments of the present invention.

DETAILED DESCRIPTION

Figure 1:
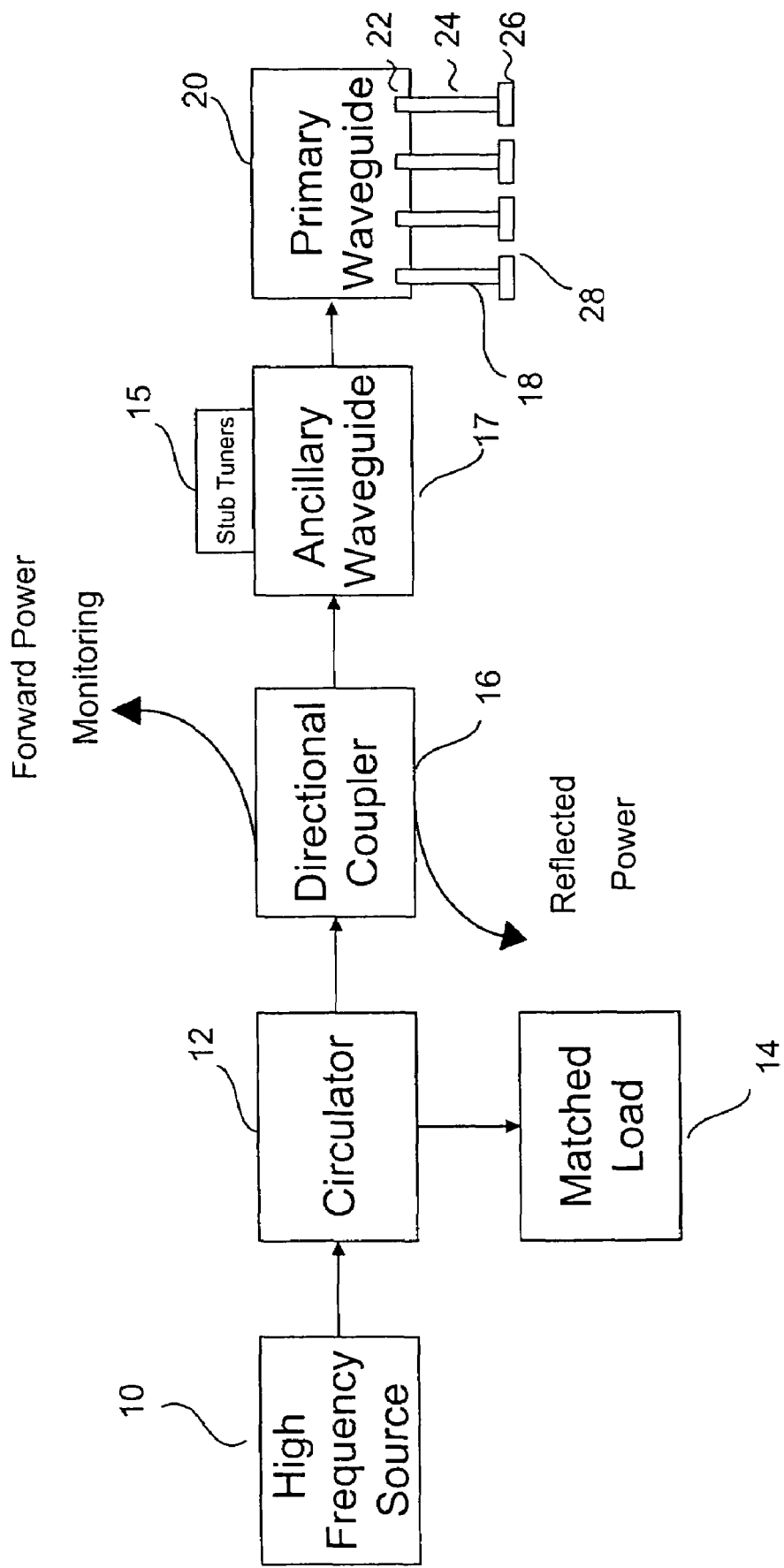
FIG. 1 is a schematic block diagram of an atmospheric pressure plasma source according to an illustrative embodiment of the present invention.

A system and method for producing plasma at atmospheric pressure is described herein with reference to FIGS. 1-4. Referring first to FIG. 1, a high frequency source 10 such as a magnetron provides power in the 1 GHz range through a primary waveguide 20 to a plasma area outside the primary waveguide 20. The high frequency source 10 can be protected from reflected power by a circulator 12 having matched loads 14 and a directional coupler 16 disposed between the high frequency source 10 and the primary waveguide 20. The use of a directional couplers 16 and a circulator 12 having a matched load 14 for protecting a high frequency source 10 from reflected power is well known and should be understood by persons having ordinary skill in the art.

One or more stub tuners 15 can be particularly configured with an ancillary waveguide 17 between the directional coupler 16 and the primary waveguide 20 to produce a high amplitude standing wave in the primary waveguide 20. A plurality of couplers 18 pass through a wall of the primary waveguide 20 and extend into a volume external to the primary waveguide 20. The couplers 18 include internal portions 22 and external portions 24. The external portions include electrodes 26. In the illustrative embodiments, one or more areas 28 for creation of plasma are defined by the gaps between electrodes 26.

Figure 2:
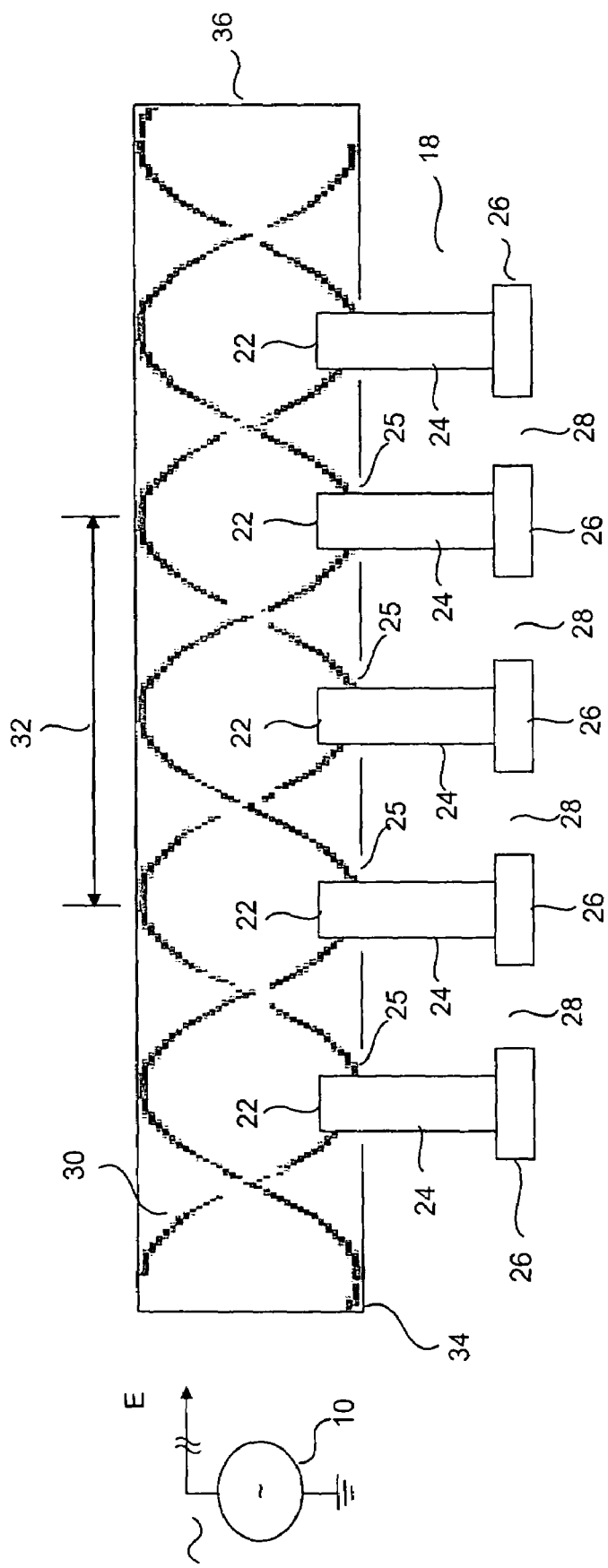
FIG. 2 is a cross-sectional view of a waveguide having a plurality of couplers arranged according to an illustrative embodiment of the present invention.

The primary waveguide 20 of an illustrative embodiment is described more particularly with reference to FIG. 2. A high frequency source 10 provides power to the primary waveguide 20. The primary waveguide 20 is configured as known in the art such that a standing wave pattern 30 is produced therein, for example, by appropriately configuring stub tuners (15 FIG. 1) in an ancillary waveguide (17 FIG. 1) in communication therewith as known in the art. The wavelength 32 in the standing wave pattern 30 corresponds to the frequency of power provided by the high frequency source 10. A plurality of couplers 18 are disposed through one or more sidewalls of the primary waveguide 20. In the illustrative embodiment, the couplers pass through clearance holes 25 and do not touch the waveguide wall. The couplers 18 can be mechanically supported relative to the primary waveguide 20 by dielectric materials, for example, as known in the art. Internal portions 22 of coupler 18 are spaced apart from internal portions 22 of adjacent couplers 18 by a distance corresponding to ½ wavelength of the standing wave 30. By spacing the internal portions 22 of adjacent couplers 18 a distance of ½ wavelength apart, adjacent couplers 18 are 180 degrees out of phase with one another.

In the illustrative embodiment described with reference to FIG. 2, electrodes are formed with the terminal portion of the external portions 24 of couplers 18. Alternative arrangements of electrodes 26 and plasma areas 28 there-between are described with reference to FIGS. 3A and 3B which are bottom views of the electrodes. FIG. 3A illustrates a configuration of adjacent rectangular electrodes 26' which are spaced to create narrow gaps there-between within which a distributed plasma 'glow' can be created. FIG. 3B illustrates a configuration of adjacent triangular electrodes 26" which are spaced apart to create an alternative arrangement of narrow gaps which define the plasma area 28. The spacing between electrodes can be significantly smaller than the waveguide wavelength, giving a further amplification of electrostatic field amplitude in the volume between electrodes. Persons having ordinary skill in the art should understand that a variety of different geometric configurations of electrodes can be envisioned within the scope of the present invention.

A major improvement provided by the present invention provides for specially designed couplers 18 having internal portions 22 spaced apart by ½ wavelength of the applied power (standing wave) and having external portions 24 spaced apart by a distance chosen to enhance the field strength therein by coupling of fields between adjacent external portions 24. Strong electric fields are thereby provided in the plasma area 28 between electrodes 26.

Although embodiments of the present invention are described with reference to FIG. 2, for example, in which a primary waveguide 20 is shown having a first end 34 in communication with the high frequency power source 10 and second end 36 that is short circuited, it is envisioned that alternative embodiments of the present invention could be constructed using a waveguide having a first end and second end which are each in communication with a separate high frequency power source without departing from the spirit and scope of the present invention.

Figure 4:
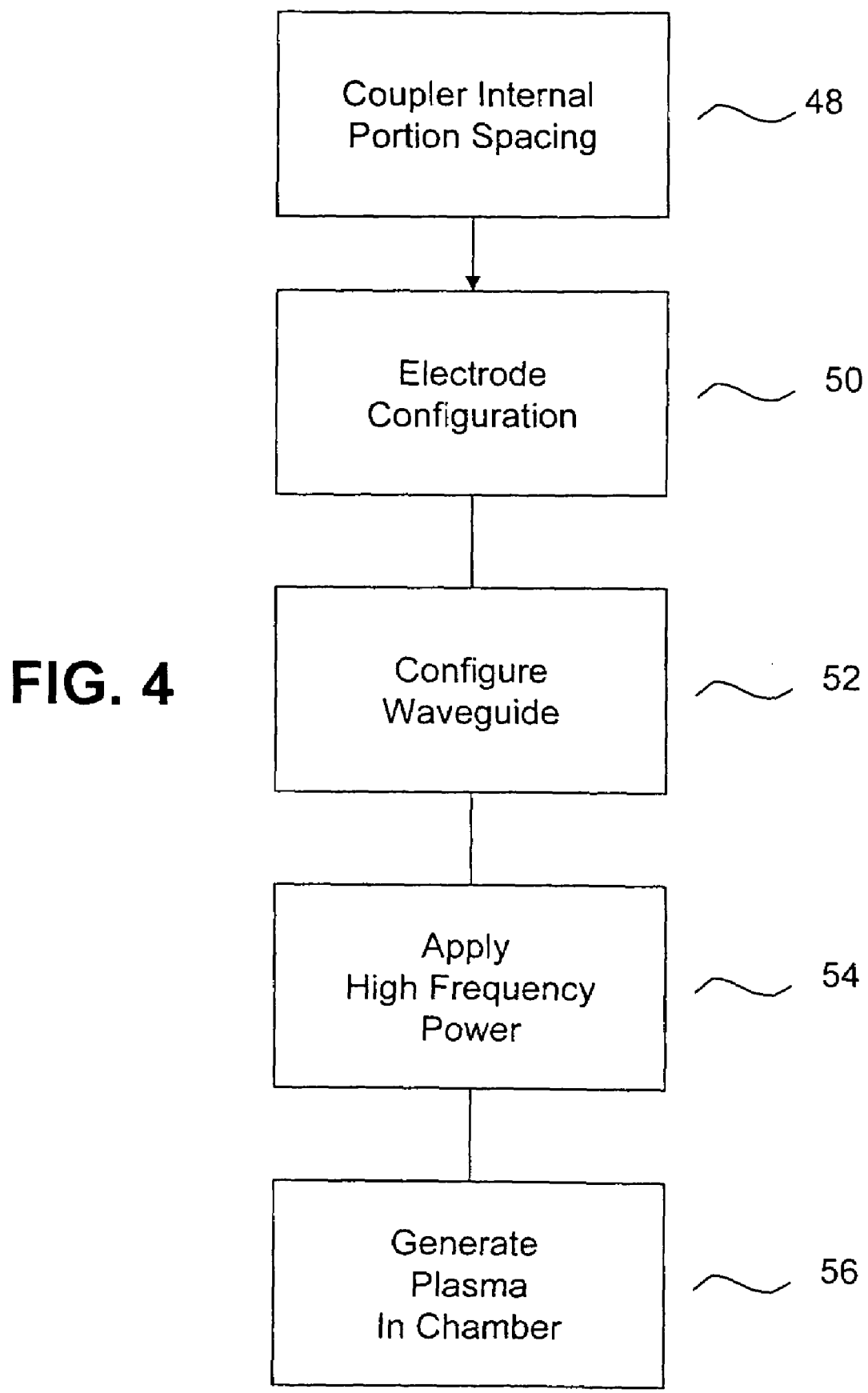
FIG. 4 is a procedural block diagram describing the steps for producing distributed plasma at atmospheric pressure according to illustrative embodiments of the present invention.

A method for producing a distributed plasma at high energy is described herein with reference to FIG. 4. In a Coupler Internal Portion Spacing step 48, a plurality of couplers are adapted to be mounted with a waveguide such that the internal portions thereof are spaced apart from one another by ½ wavelength of the high frequency power source that will be used. In an Electrode Configuration step 50, external portions of the plurality of couplers are spaced apart from each other by a distance chosen to enhance the strength of the electric fields between the electrodes disposed thereon. Persons having ordinary skill in the art should understand that the Coupler Internal Portion Spacing step 48 and the Electrode Configuration step 50 will typically be part of a design and prefabrication phase in which a set of custom stub couplers is designed for mounting through the wall of a waveguide for use according to illustrative embodiments of the present invention.

In a waveguide Configuration step 52, the couplers are mounted to the waveguide. It is envisioned that dielectric materials can be used to mount and insulate the couplers relative to the waveguide. Once the couplers and waveguide are configured, a Power Application step 54 is performed in which high frequency power is applied to the waveguide from a high frequency power source having a frequency chosen according to the particularly designed couplers, i.e. having a wavelength equal to twice the spacing between adjacent internal portions of the couplers. In a Plasma Generating step 56, the power from the waveguide, enhanced by the particular configuration of couplers and electrode design, is directed to a plasma area to generate plasma therein. In the illustrative embodiment the plasma area can include a gas, such as admixtures of helium for example, at near atmospheric pressure.

In a particular embodiment of the present invention, high frequency power is provided by a 2.45 GHz magnetron. Persons having ordinary skill in the art should understand that 2.45 GHz magnetrons are high frequency power sources used on conventional microwave ovens, for example, and are therefore readily and economically available. It should be understood that various embodiments of the present invention can be made using other high frequency power sources having a frequency of about 1 GHz or greater.

In a particular embodiment the waveguide is a TE10 mode rectangular waveguide which is well known in the art for efficient transmission of high frequency/microwave power. Persons having ordinary skill in the art should understand that a variety of waveguide modes and/or configurations could be used to generate a standing wave at microwave frequencies for use in creating a plasma according to the present invention.

The spacing between adjacent internal portions of the plurality of couplers is ½ wavelength of the 2.45 GHz power, which is about 6.1 cm in the particular embodiment. In illustrative embodiments, five to ten couplers could be used in a waveguide depending on the length of the waveguide.

The microwave energy, as enhanced by the inventive arrangement of couplers in the waveguide, can thereby be provided to a plasma area. The plasma volume can contain a gas mixture such as admixtures of helium, for example, at about atmospheric pressure. The gas in the chamber is ionized by the high frequency energy from the waveguide to produce a plasma having substantially uniform distribution along the volume between electrodes.

Within the present description, it should be understood that the term high frequency is intended to include electromagnetic radiation in the range 30 kHz-300 GHz, which is often referred to as frequency in the radio-frequency to ultra-high frequency range.

Accordingly, the various embodiments of the present invention provide a new plasma source which provides for distributed power deposition by choosing particular electrode spacing and/or power distribution to provide for a controlled distribution of plasma. In certain applications this can allow a controlled profile of the plasma so that selected regions are designed to receive greater plasma deposition than other.

Although the electrodes have been described with regard to exemplary embodiments, it should be appreciated that the configuration chosen for a specific application can provide electrodes arranged having an arbitrarily shaped plasma facing portion including for example flat, hemispheric, dome, convex, concave, undulating plasma facing portions. The electrodes could be in direct contact with the plasma or could alternatively interact with the plasma through a dielectric window provided from materials such as SiN, AlN, SiC, $SiO_2$, Si, etc.

Although illustrative embodiments of the present invention are described herein with respect to producing a plasma at atmospheric pressure, persons having ordinary skill in the art should understand that the apparatus and methods described herein can also be used for producing plasma at pressures below atmospheric pressure, for example, in a vacuum chamber. It is also envisioned that the method and apparatus disclosed herein can be used to produce plasma at pressures exceeding atmospheric pressure without departing from the spirit and scope of the present invention.

What is claimed is:

1. A plasma generator comprising:
a high frequency power source in communication with a waveguide;
a plurality of couplers extending into said waveguide wherein said couplers include external portions comprising electrodes defining a plasma area therebetween, the electrodes being spaced apart by a distance selected to increase field strength in said plasma area.

2. The plasma generator according to claim 1 wherein said plurality of couplers include internal portions being spaced apart by a distance selected to be at or near the peak of the electromagnetic field of said high frequency energy strength in said waveguide.

3. The plasma generator according to claim 1 wherein the spacing between said internal portions is substantially different from the spacing between said external portions.

4. The plasma generator according to claim 1 wherein said plurality of couplers include internal portions being spaced apart by a distance of wavelength of said high frequency energy.

5. The plasma generator according to claim 4 wherein said couplers are adapted to couple to electric field portions of said high frequency energy.

6. The plasma generator according to claim 4 wherein said couplers are adapted to couple to magnetic field portion of said high frequency energy.

7. The plasma generator according to claim 1 wherein said high frequency power source provides energy at a frequency of greater than or equal to about 1 GHz.

8. The plasma generator according to claim 1 wherein said high frequency power source is a 2.45 GHz magnetron.

9. The plasma generator according to claim 1 wherein said waveguide is a Te10 mode rectangular waveguide.

10. The plasma generator according to claim 1 wherein said waveguide directs power through said couplers to the plasma area in communication therewith.

11. The plasma generator according to claim 10 wherein the plasma area contains a gas at about atmospheric pressure.

12. The plasma generator according to claim 1 wherein said plurality of couplers are arranged to form an array of electrodes defining a plasma area in gaps between said electrodes.

13. The plasma generator according to claim 12 wherein adjacent electrodes are 180 degrees out of phase with each other.

14. The plasma generator according to claim 11 wherein said application of power to said plasma area ionizes said gas to provide a substantially uniform distribution of plasma therein.

15. The plasma generator according to claim 11 further comprising:
a circulator in communication with said high frequency power source; matched loads in communication with said circulator;
a directional coupler disposed between said circulator and said waveguide and adapted to prevent reflected power from damaging said high frequency power source.

16. The plasma generator according to claim 9 wherein said waveguide comprises a first and second end, wherein said first end is in communication with said high frequency power source and wherein said second end is short circuited.

17. The plasma generator according to claim 1 further comprising a second high frequency power source in communication with said waveguide, wherein said waveguide comprises a first end in communication with said (first) high frequency power source and a second end in communication with said second high frequency power source.

18. A plasma generator comprising:
a 2.45 GHz magnetron in communication with a circulator;
matched loads in communication with said circulator;
a directional coupler in communication with said circulator and adapted to prevent reflected power from damaging said 2.45 GHz magnetron;
a Te10 mode rectangular waveguide having a first end and a second end, wherein said first end is in communication with said directional coupler and receives microwave energy from said magnetron and said second end is short circuited such that a standing wave is formed in said waveguide;
a plurality of couplers having internal portions disposed inside said waveguide and external portions disposed outside of said waveguide, wherein said internal portions are spaced apart by a distance of ½ wavelength of said standing wave and placed relative to said second end such that each of said internal portions is aligned with a peak of said standing wave, said external portions comprises electrodes which are spaced apart such that electrical fields in adjacent external portions are coupled to enhance the field strength in the region between the external portions.

19. Plasma generating means comprising:
a high frequency power source in communication with waveguide means; coupler means in communication with said waveguide means wherein said coupler means have internal portions aligned with peaks of a standing wave in said waveguide and external portions including electrodes disposed thereon and spaced apart by a distance chosen to enhance the electric field strength
in plasma areas formed along gaps between said electrodes.

20. A method of generating a distributed plasma comprising:
spacing internal portions of stubs in a waveguide to align said internal portions with peaks of a standing wave in said waveguide;
providing external portions comprising electrodes;
spacing external portions of said electrodes by a distance chosen to generate a distributed plasma in gaps between the electrodes and having an enhanced electric field strength in said gaps; and
applying high frequency power to said waveguide to generate said distributed plasma in said gaps between said electrodes which are disposed on said external portions.

* * * * *